(12) United States Patent
Liu et al.

(10) Patent No.: US 12,345,473 B2
(45) Date of Patent: Jul. 1, 2025

(54) VAPOR CHAMBER

(71) Applicant: COOLER MASTER CO., LTD., Taipei (TW)

(72) Inventors: Lei-Lei Liu, Taipei (TW); Xuemei Wang, Taipei (TW); Xiao-Min Zhang, Taipei (TW); Hua-Yuan Lin, Taipei (TW)

(73) Assignee: COOLER MASTER CO., LTD., Taipei (TW)

( * ) Notice: Subject to any disclaimer, the term of this patent is extended or adjusted under 35 U.S.C. 154(b) by 261 days.

(21) Appl. No.: 17/886,346

(22) Filed: Aug. 11, 2022

(65) Prior Publication Data
US 2023/0175788 A1    Jun. 8, 2023

(30) Foreign Application Priority Data

Dec. 8, 2021  (CN) .......................... 202111491232.8

(51) Int. Cl.
*F28D 15/04*    (2006.01)
*F28D 15/02*    (2006.01)
*H01L 23/427*    (2006.01)

(52) U.S. Cl.
CPC ......... *F28D 15/04* (2013.01); *F28D 15/0233* (2013.01); *F28D 15/0283* (2013.01); *H01L 23/427* (2013.01); *F28D 15/0258* (2013.01); *Y02E 60/10* (2013.01)

(58) Field of Classification Search
CPC .. F28D 15/04; F28D 15/0233; F28D 15/0283; F28D 15/0258; H01L 23/427; Y02E 60/10
See application file for complete search history.

(56) References Cited

U.S. PATENT DOCUMENTS

| | | | | |
|---|---|---|---|---|
| 3,677,329 A | * | 7/1972 | Kirkpatrick | H05B 3/64 29/890.032 |
| 4,833,567 A | * | 5/1989 | Saaski | F28D 15/046 165/104.33 |
| 5,368,809 A | * | 11/1994 | Steketee, Jr. | B29C 61/06 264/269 |
| 5,386,143 A | * | 1/1995 | Fitch | H01L 23/427 165/80.4 |
| 5,704,416 A | * | 1/1998 | Larson | F28F 21/065 257/E23.09 |

(Continued)

FOREIGN PATENT DOCUMENTS

| | | | | |
|---|---|---|---|---|
| CN | 114846290 A | * | 8/2022 | ......... H05K 7/20336 |
| CN | 117751269 A | * | 3/2024 | ............. F28D 15/04 |

(Continued)

*Primary Examiner* — Ljiljana V. Ciric

(74) *Attorney, Agent, or Firm* — Merchant & Gould P.C.

(57) ABSTRACT

A vapor chamber includes a first cover, a second cover, a sealing ring and a sealing plug. The first cover has a thermal contact surface. The second cover is coupled with the first cover so as to form an interior space together, and the second cover has a vent hole. The sealing ring has a channel and at least one opening. The opening is in fluid communication with the channel, the sealing ring is clamped between the first cover and the second cover, and the vent hole is in fluid communication with the interior space via the channel and the opening. The vent hole and the channel are plugged with the sealing plug so as to seal the interior space.

12 Claims, 15 Drawing Sheets

(56) References Cited

U.S. PATENT DOCUMENTS

| | | | | |
|---|---|---|---|---|
| 5,743,014 | A * | 4/1998 | Giammaruti | F28D 15/0283 29/890.032 |
| 5,895,868 | A * | 4/1999 | Giammaruti | F28D 15/0283 73/863.81 |
| 6,286,836 | B1 * | 9/2001 | Hyllberg | D21F 5/027 277/622 |
| 6,997,245 | B2 * | 2/2006 | Lindemuth | F28D 15/046 165/104.21 |
| 9,273,910 | B2 * | 3/2016 | Wenger | F28D 15/043 |
| 11,143,460 | B2 * | 10/2021 | Lin | F28D 15/04 |
| 11,421,940 | B2 * | 8/2022 | Liu | F28D 15/0283 |
| 11,460,255 | B2 * | 10/2022 | Lin | C23F 17/00 |
| 11,635,263 | B2 * | 4/2023 | Chen | F28D 15/0233 165/104.26 |
| 11,706,902 | B2 * | 7/2023 | Chan | B33Y 10/00 361/699 |
| 12,025,382 | B2 * | 7/2024 | Wang | F28F 3/12 |
| 12,117,244 | B2 * | 10/2024 | Chen | F28D 15/0283 |
| 2006/0096740 | A1 * | 5/2006 | Zheng | F28D 15/0233 165/104.33 |
| 2009/0040726 | A1 * | 2/2009 | Hoffman | F28D 15/0233 29/890.032 |
| 2009/0260785 | A1 * | 10/2009 | Wang | F28D 15/046 165/170 |
| 2017/0023308 | A1 * | 1/2017 | Huang | F28F 3/00 |
| 2019/0331430 | A1 * | 10/2019 | Tseng | F28D 15/0283 |
| 2020/0064080 | A1 * | 2/2020 | Huang | F28D 15/0233 |
| 2020/0355444 | A1 * | 11/2020 | Chen | F28D 15/0283 |
| 2021/0364238 | A1 * | 11/2021 | Wang | F28D 15/0233 |
| 2023/0175788 | A1 * | 6/2023 | Liu | F28D 15/0283 165/104.26 |
| 2023/0204300 | A1 * | 6/2023 | Chen | F28D 15/046 165/104.26 |
| 2024/0179871 | A1 * | 5/2024 | Lin | F28F 3/12 |
| 2024/0206119 | A1 * | 6/2024 | Lin | H05K 7/20336 |
| 2024/0344773 | A1 * | 10/2024 | Wong | F28D 15/046 |
| 2024/0347419 | A1 * | 10/2024 | Lin | H01L 23/4006 |

FOREIGN PATENT DOCUMENTS

| | | | | |
|---|---|---|---|---|
| DE | 19610853 A1 | * | 9/1996 | F28D 15/0266 |
| KR | 10-2021-0118688 | * | 10/2021 | |
| TW | 201315359 A | * | 4/2013 | |

* cited by examiner

VAPOR CHAMBER

CROSS-REFERENCE TO RELATED APPLICATIONS

This non-provisional application claims priority under 35 U.S.C. § 119(a) on Patent Application No(s). 202111491232.8 filed in China on Dec. 8, 2021, the entire contents of which are hereby incorporated by reference.

TECHNICAL FIELD

The disclosure relates to a heat dissipation device, more particularly to a vapor chamber.

BACKGROUND

In general, a heat pipe only transfers heat in one dimension (i.e., the axis of the heat pipe), and a vapor chamber can be regard as a planar heat pipe that can transfer heat in two dimensions. The vapor chamber mainly includes a plate body and a capillary structure. The plate body has a chamber filled with a working fluid. The capillary structure is accommodated in the chamber. A part of the plate body that is heated defines an evaporation space of the chamber, and a part of the plate body that dissipates heat defines a condensation space of the chamber. The working fluid in the evaporation space is evaporated into vapor, and then flows to the condensation space due to the pressure difference. The working fluid flowing to the condensation space is condensed into liquid and then flows back to the evaporation space with the help of the capillary structure.

A conventional vapor chamber has a pipe insertion portion at a lateral edge thereof formed by a stamping process, and the pipe insertion portion is for a filling/degassing pipe mounted thereon. After a filling/degassing process, the pipe insertion portion is required to be sealed by multiple cumbersome processes such as a compressing process and soldering process. In addition, when the pipe insertion portion of the vapor chamber is being formed, a part of the vapor chamber may be sacrificed, such that the appearance of the vapor chamber may be adversely affected by the pipe insertion portion. Since the pipe insertion portion of the conventional vapor chamber is located at the lateral edge thereof, the pipe diameter of the filling/degassing pipe is required to be smaller than the thickness of the vapor chamber and thus is limited by the thickness of the vapor chamber.

Moreover, a radio frequency heating process and a soldering process may be performed for sealing the gap between the pipe insertion portion of the vapor chamber and the filling/degassing pipe mounted thereon. However, during the radio frequency heating process, related parameters of heating (e.g., heating time, heating power, radio frequency, and the amount of solder) are hard to be controlled. When the related parameters of heating are improperly controlled, the sealing of the vapor chamber may be adversely affected. Specifically, when the heating time is too long, the pipe insertion may be overly heated, such that the fluidity of the solder may increase and the cooling speed of the solder may reduce. Therefore, the solder may flow into the vapor chamber through the gap between the pipe insertion portion and the filling/degassing pipe and attach on the capillary structure in the vapor chamber, thus reducing the effect of the capillary structure.

SUMMARY

The disclosure provides a vapor chamber which can be sealed in a convenient manner after the filling/degassing process; that is, the radio frequency heating process and the soldering process can be saved, and thus the capillary structure in the vapor chamber can be prevented from adversely affected by the radio frequency heating process and the soldering process. In addition, since the installation position of the vapor chamber for the degassing pipe is modified, the pipe diameter of the degassing pipe is no longer limited by the thickness of the vapor chamber.

One embodiment of the disclosure provides a vapor chamber. The vapor chamber includes a first cover, a second cover, a sealing ring and a sealing plug. The first cover has a thermal contact surface. The second cover is coupled with the first cover so as to form an interior space together, and the second cover has a vent hole. The sealing ring has a channel and at least one opening. The opening is in fluid communication with the channel, the sealing ring is clamped between the first cover and the second cover, and the vent hole is in fluid communication with the interior space via the channel and the opening. The vent hole and the channel are plugged with the sealing plug so as to seal the interior space.

Another embodiment of the disclosure provides a vapor chamber. The vapor chamber includes a chamber and a sealing plug. The chamber includes a bottom portion, a side portion, and a top portion. The bottom portion, the side portion and the top portion together surround an interior space, the bottom portion has a thermal contact surface, the thermal contact surface faces away from the interior space, the top portion has a vent hole, and the vent hole is spaced apart from the side portion. The vent hole is plugged with the sealing plug so as to seal the interior space.

According to the vapor chambers as discussed in the above embodiments, since the vent hole is located at the second cover instead of the side edge of the vapor chamber, the rat tail area of the vapor chamber can be reduced so as to keep the appearance of the vapor chamber, thereby increasing the heat dissipation area of the vapor chamber. In addition, since the vent hole for the installation of a degassing pipe is modified to be located at the second cover, the pipe diameter of the degassing pipe is no longer limited by the thickness of the vapor chamber.

In addition, since the vent hole is located at the second cover instead of the side edge of the vapor chamber, the vent hole can be sealed in a convenient manner after the filling/degassing process; that is, a radio frequency heating process and a soldering process can be saved, and thus a capillary structure in the vapor chamber can be prevented from adversely affected by the radio frequency heating process and the soldering process.

BRIEF DESCRIPTION OF THE DRAWINGS

The present disclosure will become better understood from the detailed description given herein below and the accompanying drawings which are given by way of illustration only and thus are not intending to limit the present disclosure and wherein.

DETAILED DESCRIPTION

Figure 1:
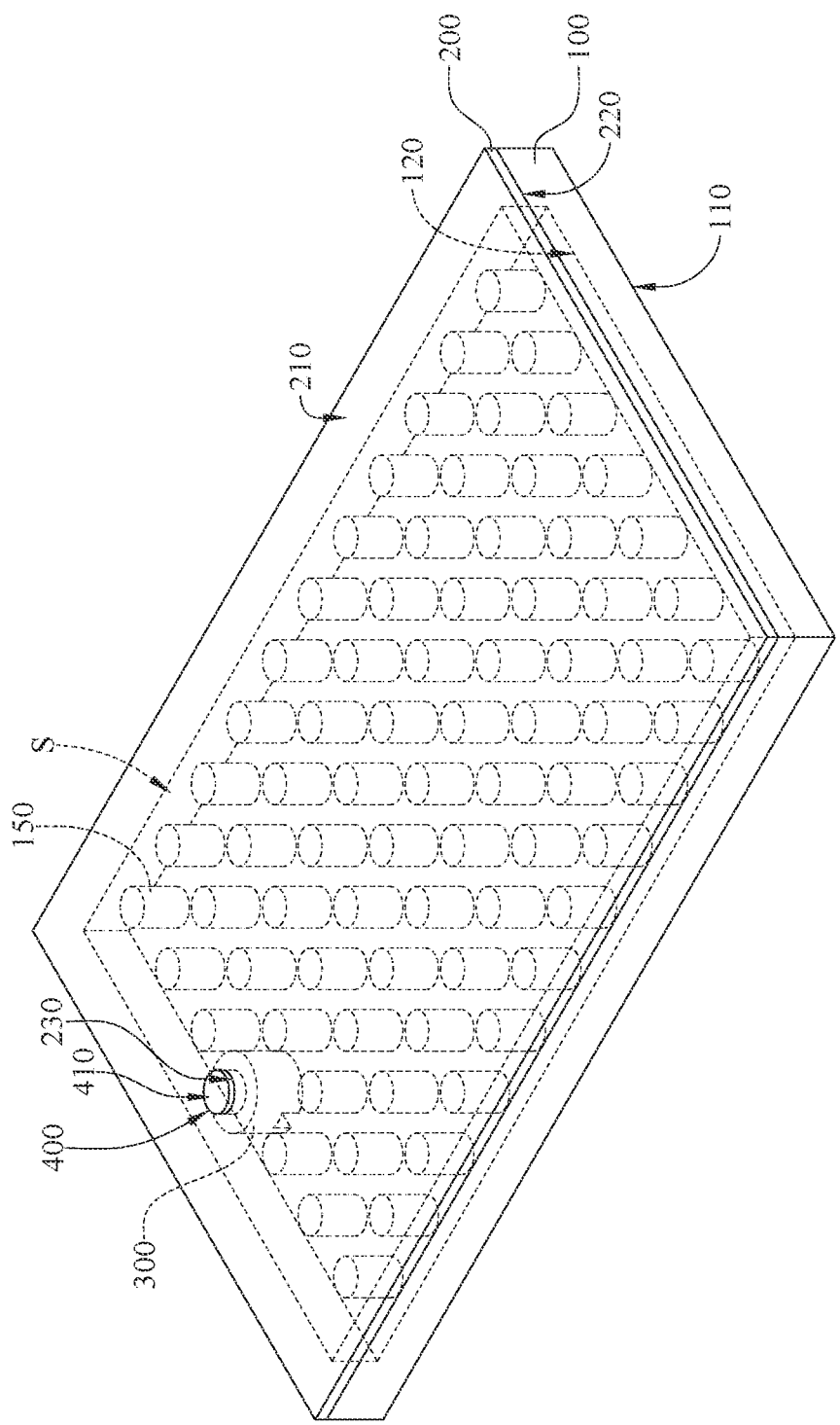
FIG. 1 is a perspective view of a vapor chamber according to a first embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In addition, the terms used in the present disclosure, such as technical and scientific terms, have its own meanings and can be comprehended by those skilled in the art, unless the terms are additionally defined in the present disclosure. That is, the terms used in the following paragraphs should be read on the meaning commonly used in the related fields and will not be overly explained, unless the terms have a specific meaning in the present disclosure.

Figure 2:
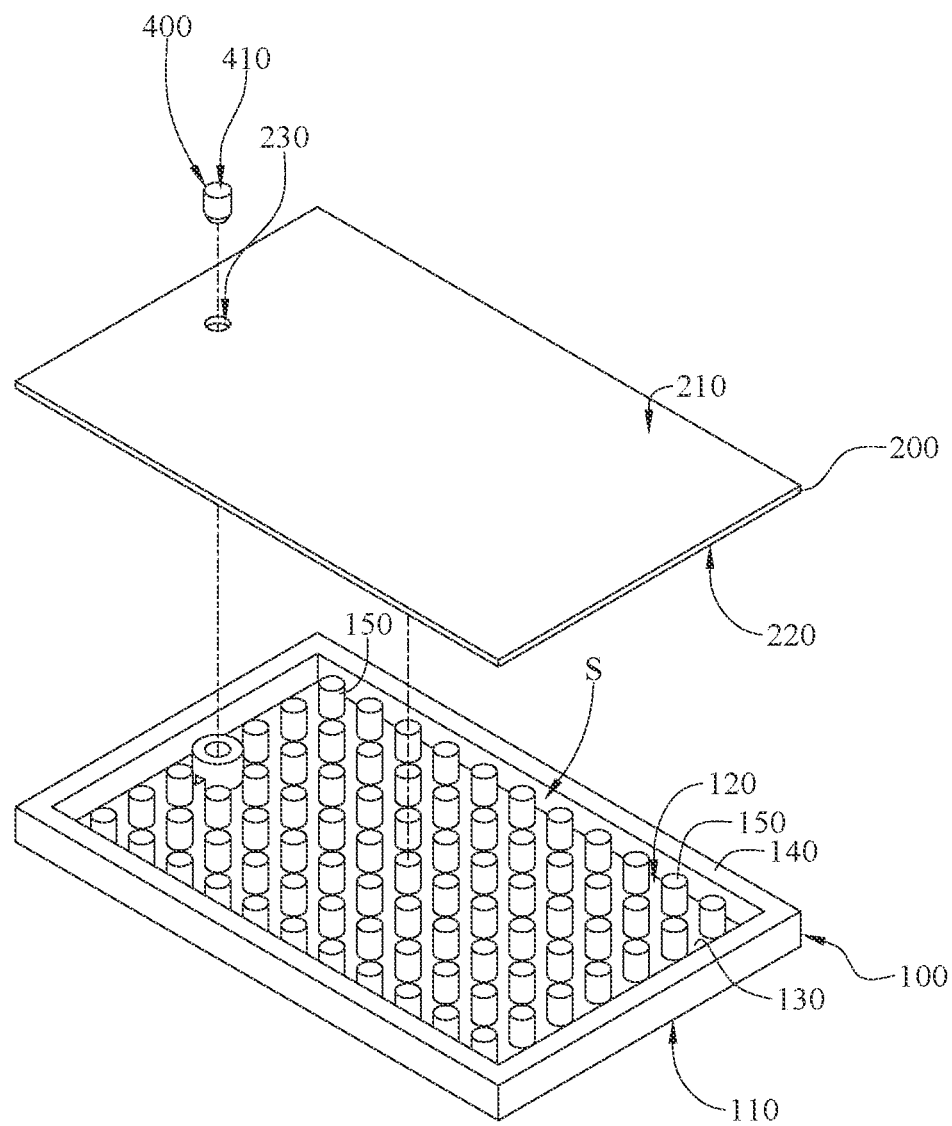
FIG. 2 is an exploded view of the vapor chamber in FIG. 1.
Figure 3:
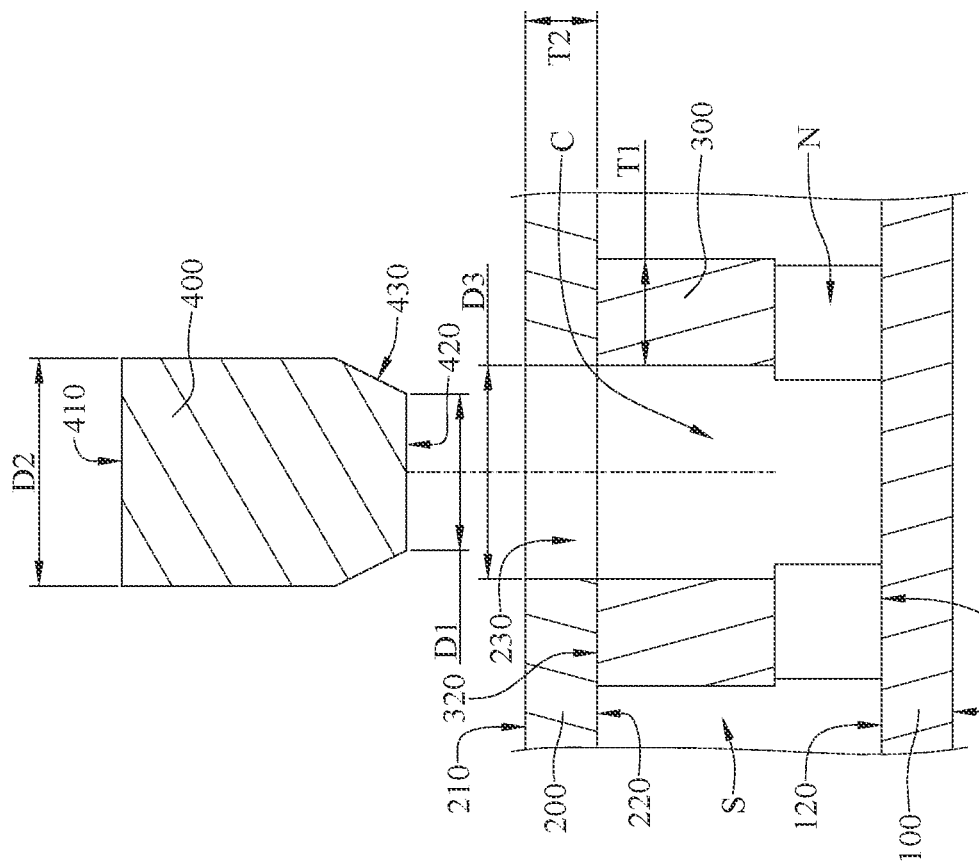
FIG. 3 is a cross-sectional planar view of the vapor chamber in FIG. 1 when a vent hole is not plugged with a sealing plug yet.
Figure 4:
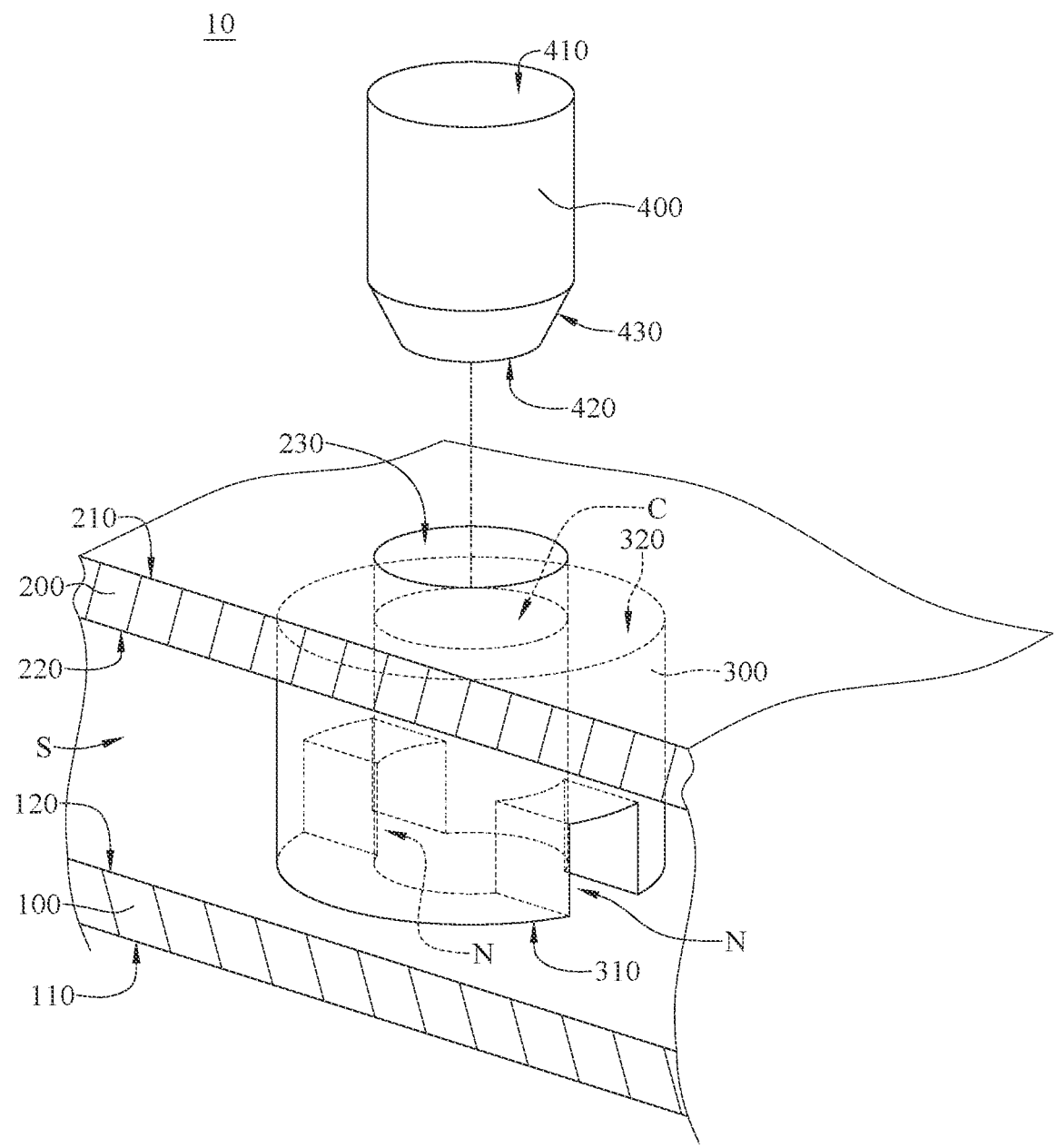
FIG. 4 is a partial cross-sectional perspective view of the vapor chamber in FIG. 3.
Figure 5:
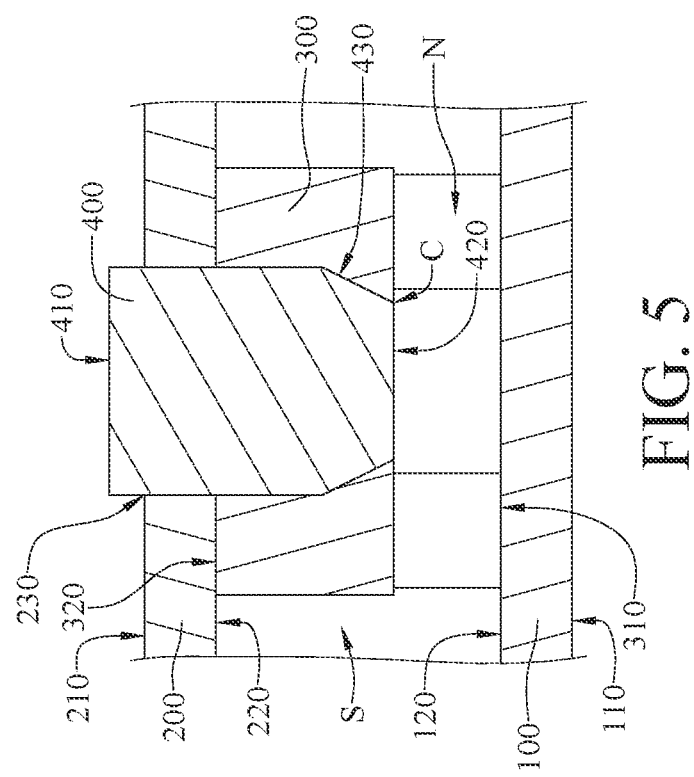
FIG. 5 is a partial cross-sectional planar view of the vapor chamber in FIG. 1.

Refer to FIGS. 1 to 5, where FIG. 1 is a perspective view of a vapor chamber 10 according to a first embodiment of the disclosure, FIG. 2 is an exploded view of the vapor chamber 10 in FIG. 1, FIG. 3 is a cross-sectional planar view of the vapor chamber 10 in FIG. 1 when a vent hole 230 is not plugged with a sealing plug 400 yet, FIG. 4 is a partial cross-sectional perspective view of the vapor chamber 10 in FIG. 3, and FIG. 5 is a partial cross-sectional planar view of the vapor chamber 10 in FIG. 1.

In this embodiment, the vapor chamber 10 is configured to accommodate a coolant (not shown), such as water, refrigerant, or a fluid changeable between two phases. The vapor chamber 10 includes a first cover 100, a second cover 200, a sealing ring 300, and a sealing plug 400. The first cover 100 and the second cover 200 are made of copper, aluminum or another thermally conductive material. The first cover 100 has a thermal contact surface 110 and an inner surface 120. The thermal contact surface 110 is configured to be in thermal contact with a heat source (not shown). The heat source is, for example, a CPU or GPU. The inner surface 120 faces away from the thermal contact surface 110. The second cover 200 and the first cover 100 are coupled with each other so as to form an interior space S together. Specifically, the second cover 200 has an outer surface 210 and an inner surface 220 located opposite to each other. The inner surface 220 of the second cover 200 is partially in contact with the first cover 100, such that a part of the inner surface 220 of the second cover 200 and the inner surface 120 of the first cover 100 together surround the interior space S. In addition, the second cover 200 has a vent hole 230. The vent hole 230 is disposed through the outer surface 210 and the inner surface 220 of the second cover 200 and is in fluid communication with the interior space S.

In this embodiment, each of the first cover 100 and the second cover 200 is integrally formed as one body via a computer numerical control machine or a forging die. The first cover 100 includes a plate 130, a frame 140 and a plurality of support pillars 150. The frame 140 is integrally connected to the plate 130. The support pillars 150 are integrally connected to the plate 130 and surrounded by the frame 140. When the second cover 200 and the first cover 100 are coupled with each other, the support pillars 150 support the second cover 200 for enhancing the structural strength of the vapor chamber 10.

The sealing ring 300 is clamped between the first cover 100 and the second cover 200. Specifically, the sealing ring 300 has a first support end surface 310, a second support end surface 320, a channel C and two openings N. The second support end surface 320 faces away from the first support end surface 310, and the first support end surface 310 and the second support end surface 320 are respectively in contact with the first cover 100 and the second cover 200. The channel C extends inwards from the second support end surface 320, and the two openings N are located close to the first support end surface 310 and in fluid communication with the channel C. In addition, the channel C corresponds to the vent hole 230; that is, the channel C is in fluid communication with the vent hole 230, and the vent hole 230 is in fluid communication with the interior space S via the channel C and the openings N. Therefore, a filling/degassing process can be performed on the interior space S of the vapor chamber 10 through the vent hole 230.

Note that the quantity of the openings N is not restricted in the disclosure and may be modified to be one or more than two in some other embodiments.

The sealing plug 400 is inserted into the vent hole 230 and the channel C, so that the vent hole 230 and the channel C are plugged with the sealing plug 400 to seal the interior space S. The sealing plug 400 has a top end surface 410, a bottom end surface 420 and an annular inclined guide surface 430. The bottom end surface 420 faces away from the top end surface 410. When the vent hole 230 and the channel C are plugged with the sealing plug 400, the bottom end surface 420 faces the inner surface 120 of the first cover 100. The annular inclined guide surface 430 is connected to the bottom end surface 420, and a diameter D1 of the bottom end surface 420 is smaller than a diameter D2 of the top end surface 410. The diameter D2 of the top end surface 410 is greater than diameters D3 of the vent hole 230 and the channel C, and the diameter D1 of the bottom end surface 420 is smaller than or equal to the diameters D3 of the vent hole 230 and the channel C. The annular inclined guide surface 430 facilitates the vent hole 230 and the channel C to be plugged with the sealing plug 400 via an interference fit manner (as shown in FIG. 5).

In this embodiment, a melting point of the sealing plug 400 is not required to be lower than a melting point of the second cover 200.

In this embodiment, the top end surface 410 is non-coplanar with the outer surface 210, but the disclosure is not limited thereto; in some other embodiments, the top end surface may be coplanar with the outer surface.

In this embodiment, since the sealing ring 300 and the second cover 200 or the first cover 100 are independent components, a thickness T1 of the sealing ring 300 may be modified according to actual sealing requirements. In order to improve the sealing of the vent hole 230, the thickness T1 of the sealing ring 300 may be designed to be greater than a thickness T2 of the second cover 200.

Figure 6:
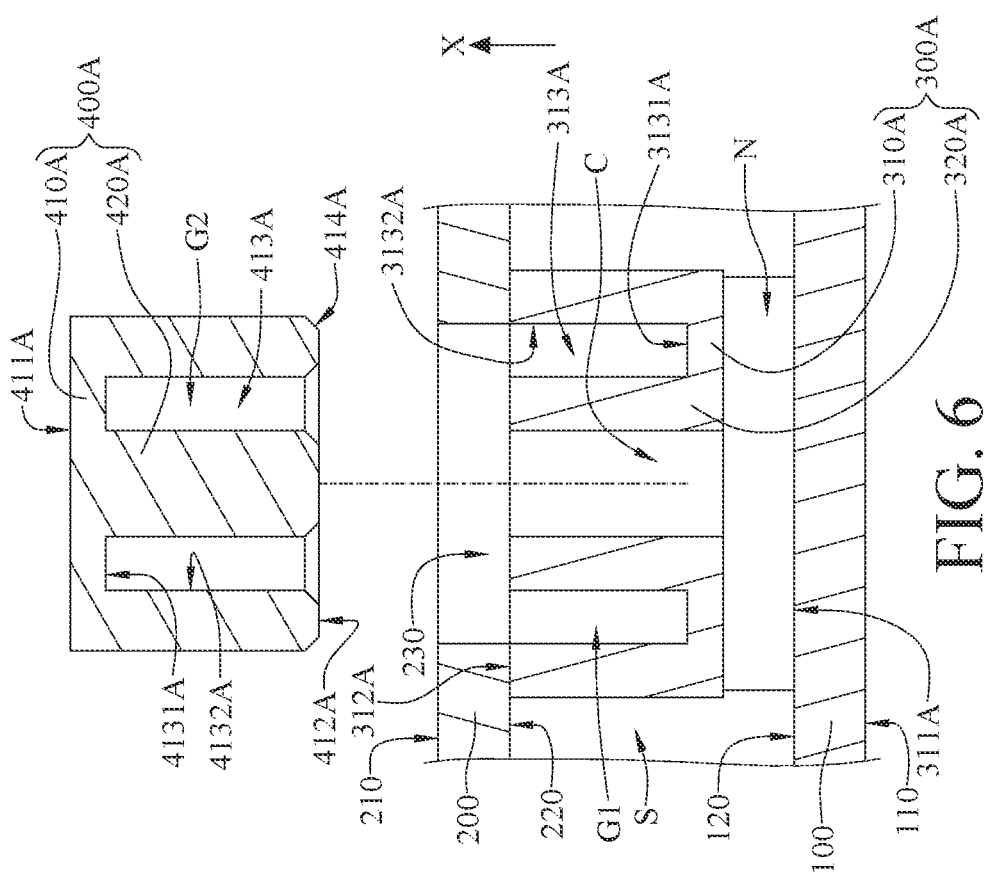
FIG. 6 is a partial cross-sectional planar view of a vapor chamber according to a second embodiment of the disclosure when a vent hole is not plugged with a sealing plug yet.
Figure 7:
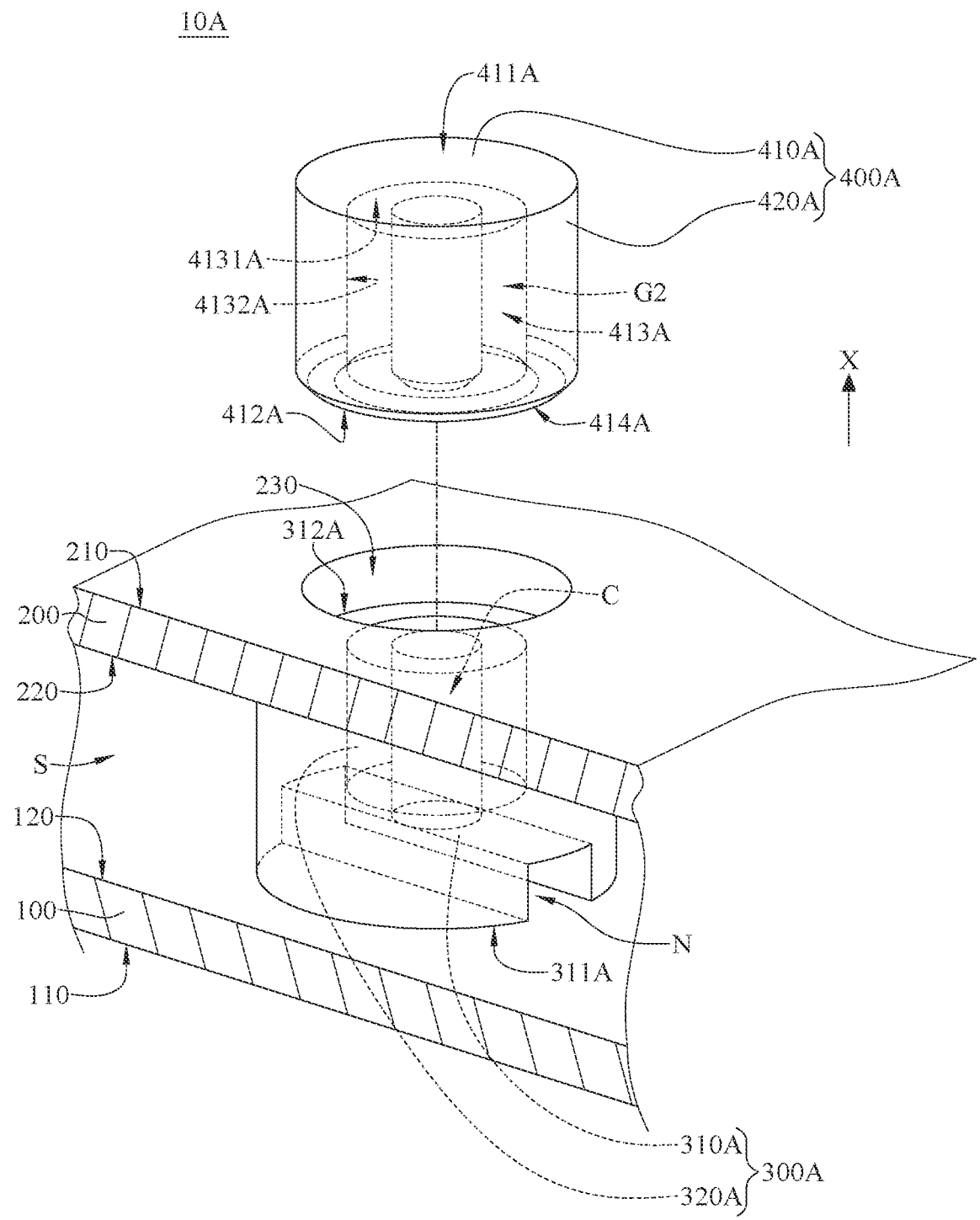
FIG. 7 is a partial cross-sectional perspective view of the vapor chamber in FIG. 6.
Figure 8:
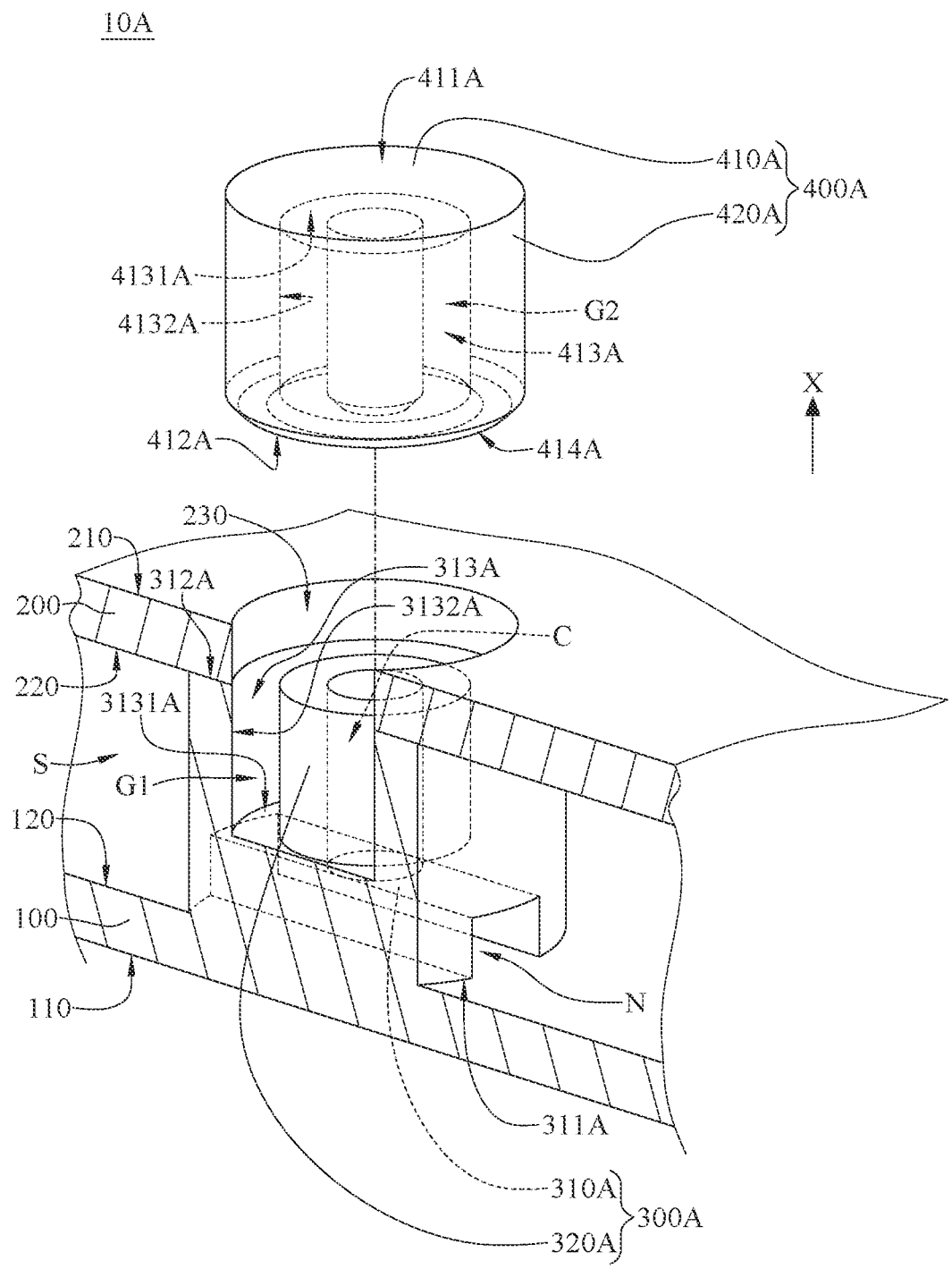
FIG. 8 is another partial cross-sectional perspective view of the vapor chamber in FIG. 6.
Figure 9:
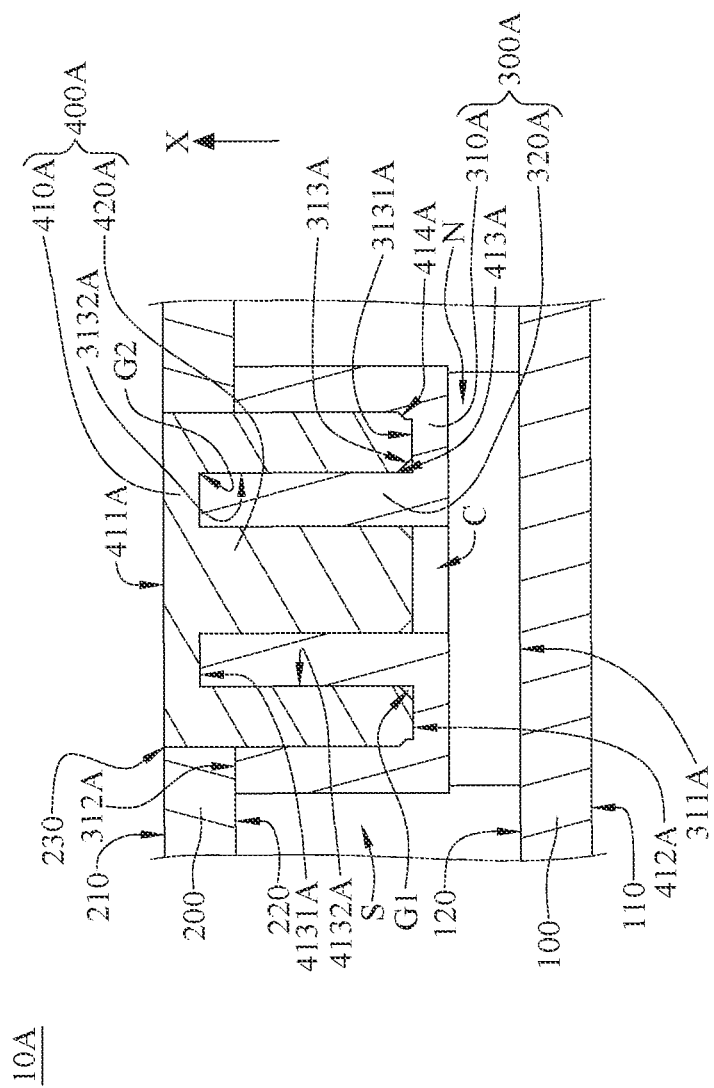
FIG. 9 is a partial cross-sectional planar view of the vapor chamber in FIG. 6 when the vent hole is plugged with the sealing plug.

Refer to FIGS. 6 to 9, where FIG. 6 is a partial cross-sectional planar view of a vapor chamber 10A according to a second embodiment of the disclosure when a vent hole 230 is not plugged with a sealing plug 400A yet, FIG. 7 is a partial cross-sectional perspective view of the vapor chamber 10A in FIG. 6, FIG. 8 is another partial cross-sectional perspective view of the vapor chamber 10A in FIG. 6, and FIG. 9 is a partial cross-sectional planar view of the vapor chamber 10A in FIG. 6 when the vent hole 230 is plugged with the sealing plug 400A.

In this embodiment, the vapor chamber 10A is configured to accommodate a coolant (not shown), such as water, refrigerant, or a fluid changeable between two phases. The vapor chamber 10A includes a first cover 100, a second cover 200, a sealing ring 300A, and a sealing plug 400A. The first cover 100 and the second cover 200 are made of copper, aluminum or another thermally conductive material. The first cover 100 has a thermal contact surface 110 and an inner surface 120. The thermal contact surface 110 is configured to be in thermal contact with a heat source (not shown). The heat source is, for example, a CPU or GPU. The inner surface 120 faces away from the thermal contact surface 110. The second cover 200 and the first cover 100 are coupled with each other so as to form an interior space S together. Specifically, the second cover 200 has an outer surface 210 and an inner surface 220 located opposite to each other. The inner surface 220 of the second cover 200 is partially in contact with the first cover 100, such that a part of the inner surface 220 of the second cover 200 and the inner surface 120 of the first cover 100 together surround the interior space S. In addition, the second cover 200 has a vent hole 230. The vent hole 230 is disposed through the outer surface 210 and the inner surface 220 of the second cover 200 and is in fluid communication with the interior space S.

The sealing ring 300A is clamped between the first cover 100 and the second cover 200. Specifically, the sealing ring 300A includes a support portion 310A and a first protrusion portion 320A. The support portion 310A has a first support end surface 311A, a second support end surface 312A and a first recess 313A. The first support end surface 311A and the second support end surface 312A of the support portion 310A are respectively in contact with the first cover 100 and the second cover 200. The first recess 313A is recessed inwards from the second support end surface 312A. The support portion 310A has a first inner bottom surface 3131A and a first annular inner side surface 3132A forming the first recess 313A. The first inner bottom surface 3131A faces away from the first cover 100. The first annular inner side surface 3132A is connected to a periphery of the first inner bottom surface 3131A. The first protrusion portion 320A protrudes from the first inner bottom surface 3131A and is spaced apart from the first annular inner side surface 3132A by a first gap G1. The channel C penetrates through the first protrusion portion 320A and the support portion 310A along an axis X of the first protrusion portion 320A and is in fluid communication with an opening N of the support portion 310A. In addition, the channel C corresponds to the vent hole 230; that is, the channel C is in fluid communication with the vent hole 230, and the vent hole 230 is in fluid communication with the interior space S via the channel C and the opening N. Therefore, a filling/degassing process can be performed on the interior space S of the vapor chamber 10 through the vent hole 230.

The sealing plug 400A includes a main body 410A and a second protrusion 420A. The main body 410A has a top end surface 411A, a bottom end surface 412A and a second recess 413A. The bottom end surface 412A faces away from the top end surface 411A and faces the first cover 100. The second recess 413A is recessed inwards from the bottom end surface 412A. The main body 410A has a second inner bottom surface 4131A and a second annular inner side surface 4132A forming the second recess 413A. The second inner bottom surface 4131A faces the first cover 100. The second annular inner side surface 4132A is connected to a periphery of the second inner bottom surface 4131A. The second protrusion 420A protrudes from the second inner bottom surface 4131A and is spaced apart from the second annular inner side surface 4132A by a second gap G2. The channel C is plugged with the second protrusion 420A. The first gap G1 is plugged with a part of the main body 410A, and the second gap G2 is plugged with a part of the first protrusion portion 320A.

In this embodiment, the sealing plug 400A further has an annular inclined guide surface 414A. The annular inclined guide surface 414A is connected to the bottom end surface 412A. The annular inclined guide surface 414A facilitates the sealing plug 400A to be inserted into the vent hole 230 and the channel C, such that the vent hole 230, the channel C and the first gap G1 are plugged with the main body 410A and the second protrusion 420A of the sealing plug 400A via an interference fit manner (as shown in FIG. 9).

The recesses and the protrusion portions of the sealing plug 400A and the sealing ring 300A can increase the contact area between the sealing plug 400A and the sealing ring 300A, thereby further enhancing the sealing of the vent hole 230.

Figure 10:
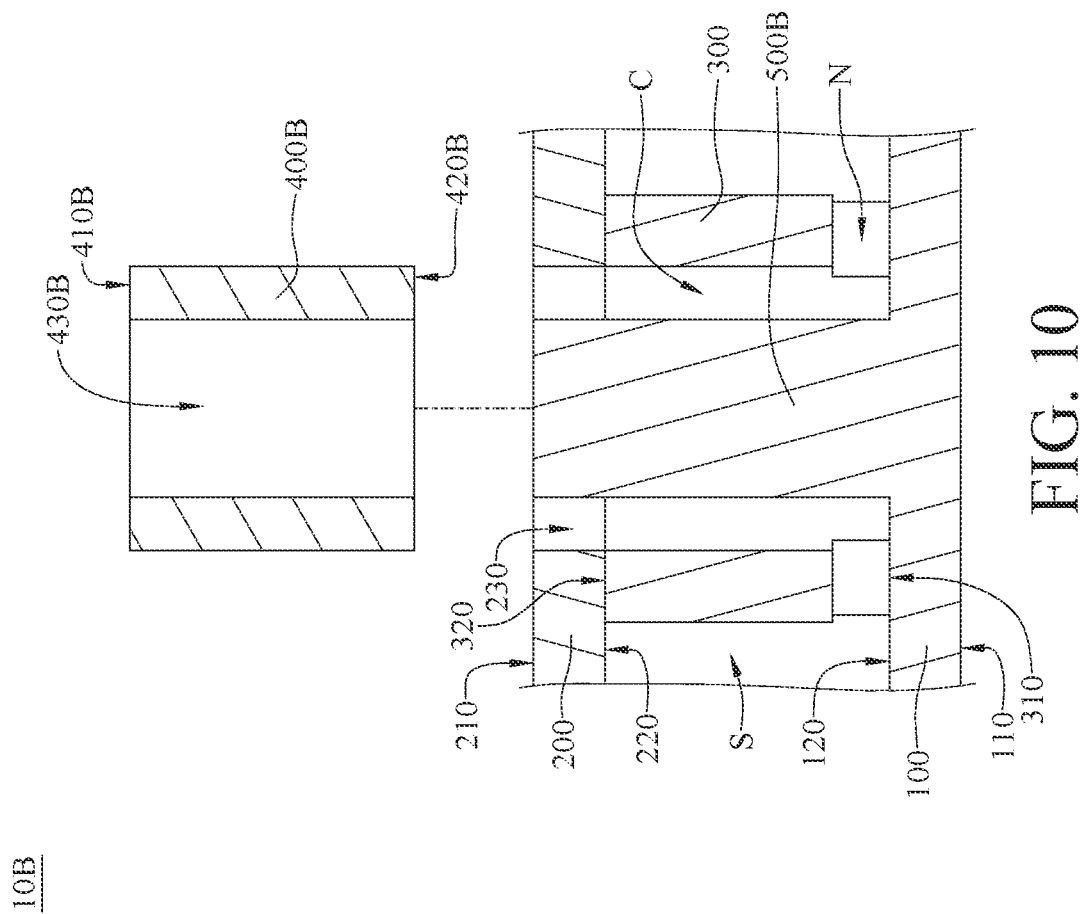
FIG. 10 is a partial cross-sectional planar view of a vapor chamber according to a third embodiment of the disclosure when a vent hole is not plugged with a sealing plug yet.
Figure 11:
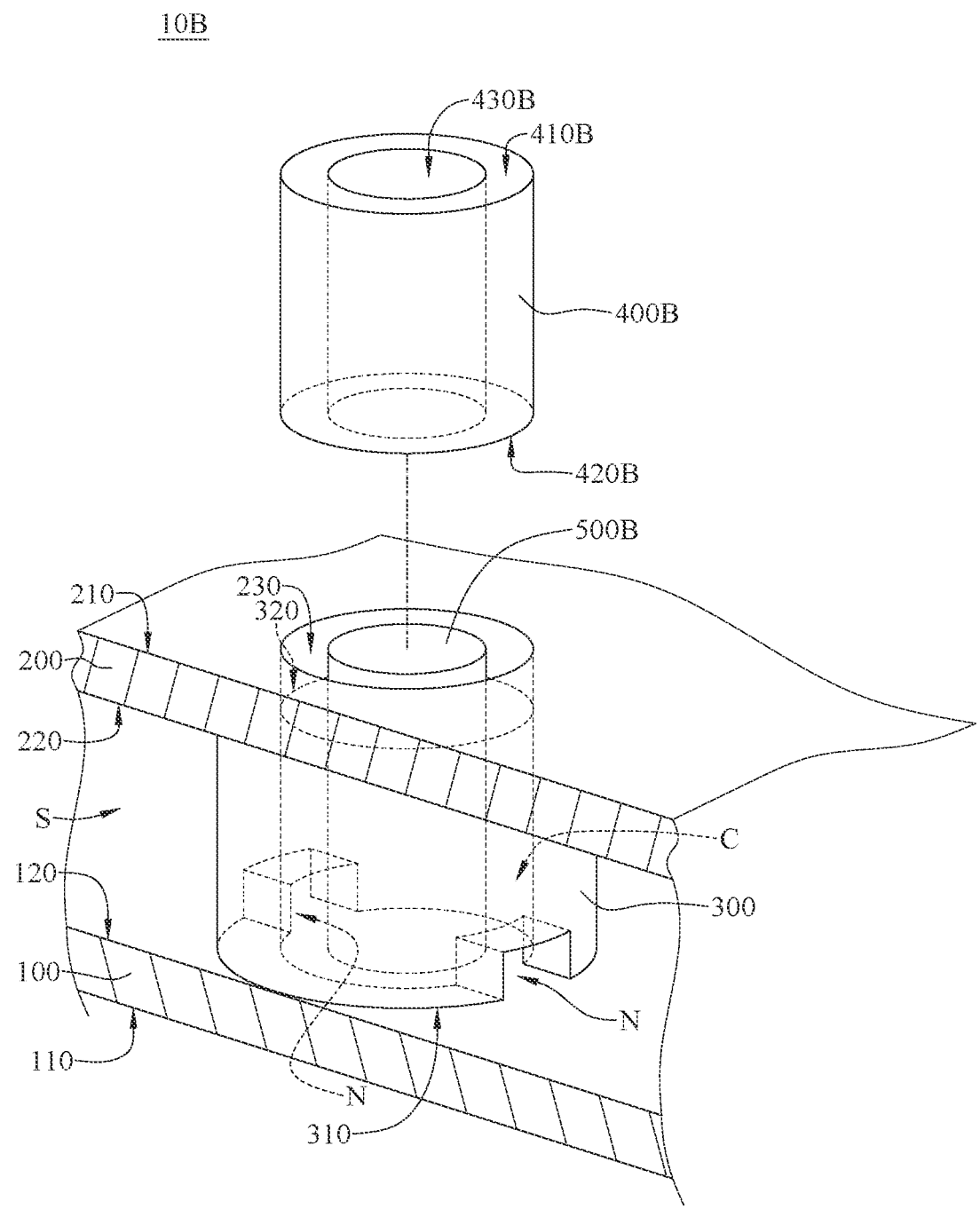
FIG. 11 is a partial cross-sectional perspective view of the vapor chamber in FIG. 10.
Figure 12:
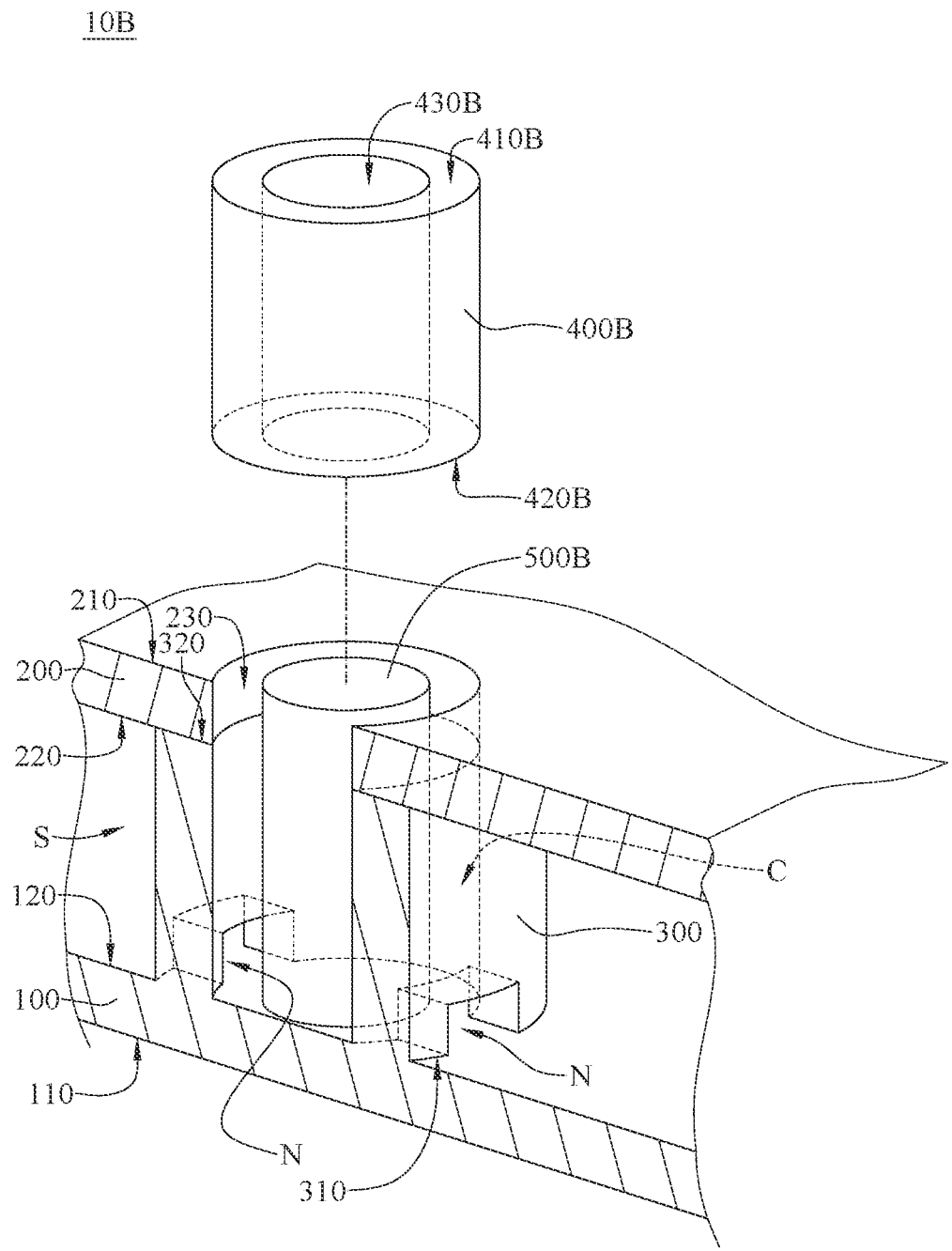
FIG. 12 is another partial cross-sectional perspective view of the vapor chamber in FIG. 10.
Figure 13:
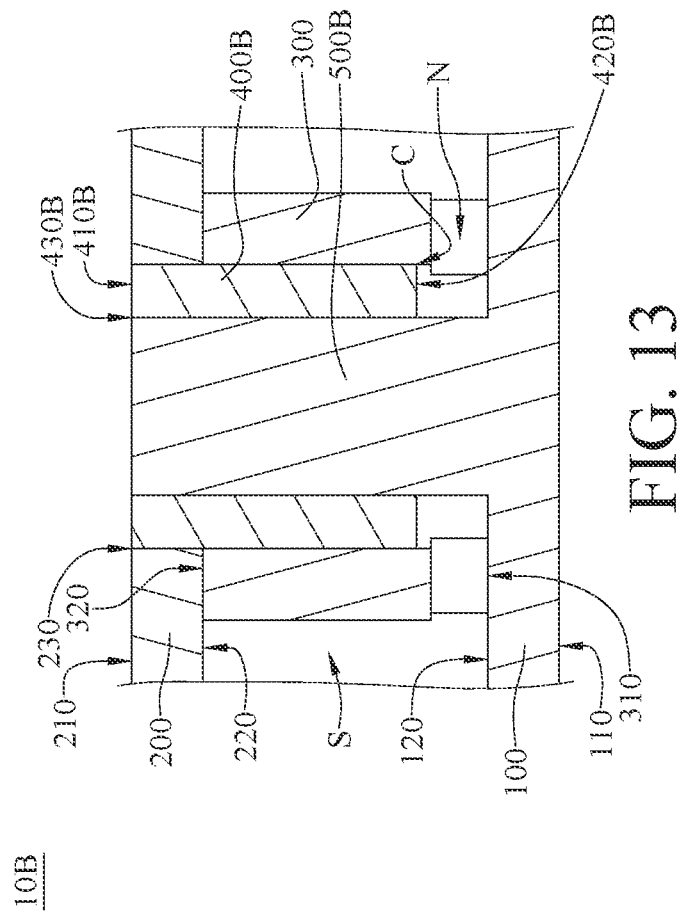
FIG. 13 is a partial cross-sectional planar view of the vapor chamber in FIG. 10 when the vent hole is plugged with the sealing plug.

Refer to FIGS. 10 to 13, where FIG. 10 is a partial cross-sectional planar view of a vapor chamber 10B according to a third embodiment of the disclosure when a vent hole 230 is not plugged with a sealing plug 400B yet, FIG. 11 is a partial cross-sectional perspective view of the vapor chamber 10B in FIG. 10, FIG. 12 is another partial cross-sectional perspective view of the vapor chamber 10B in FIG. 10, and FIG. 13 is a partial cross-sectional planar view of the vapor chamber 10B in FIG. 10 when the vent hole 230 is plugged with the sealing plug 400B.

In this embodiment, the vapor chamber 10B is configured to accommodate a coolant (not shown), such as water, refrigerant, or a fluid changeable between two phases. The vapor chamber 10B includes a first cover 100, a second cover 200, a sealing ring 300, a sealing plug 400B and a sealing pillar 500B. The first cover 100 and the second cover 200 are made of copper, aluminum or another thermally conductive material. The first cover 100 has a thermal contact surface 110 and an inner surface 120. The thermal contact surface 110 is configured to be in thermal contact with a heat source (not shown). The heat source is, for example, a CPU or GPU. The inner surface 120 faces away from the thermal contact surface 110. The second cover 200 and the first cover 100 are coupled with each other so as to form an interior space S together. Specifically, the second cover 200 has an outer surface 210 and an inner surface 220 located opposite to each other. The inner surface 220 of the second cover 200 is partially in contact with the first cover 100, such that a part of the inner surface 220 of the second cover 200 and the inner surface 120 of the first cover 100 together surround the interior space S. In addition, the second cover 200 has a vent hole 230. The vent hole 230 is disposed through the outer surface 210 and the inner surface 220 of the second cover 200 and is in fluid communication with the interior space S.

The sealing ring 300 is clamped between the first cover 100 and the second cover 200. Specifically, the sealing ring 300 has a first support end surface 310, a second support end surface 320, a channel C and two openings N. The second support end surface 320 faces away from the first support end surface 310, and the first support end surface 310 and the second support end surface 320 are respectively in contact with the first cover 100 and the second cover 200. The channel C extends inwards from the second support end surface 320, and the two openings N are located close to the first support end surface 310 and in fluid communication with the channel C. In addition, the channel C corresponds to the vent hole 230; that is, the channel C is in fluid communication with the vent hole 230, and the vent hole 230 is in fluid communication with the interior space S via the channel C and the openings N. Therefore, a filling/degassing process can be performed on the interior space S of the vapor chamber 10 through the vent hole 230.

Note that the quantity of the openings N is not restricted in the disclosure and may be modified to be one or more than two in some other embodiments.

The sealing pillar 500B protrudes from the inner surface 120 of the first cover 100 and is partially located in the vent hole 230 of the second cover 200. The vent hole 230 and the channel C are plugged with the sealing plug 400B so as to seal the interior space S. The sealing plug 400B has a top end surface 410B, a bottom end surface 420B and a central insertion hole 430B. The bottom end surface 420B faces away from the top end surface 410B. When the vent hole 230 and the channel C are plugged with the sealing plug 400B, the bottom end surface 420B faces the inner surface 120 of the first cover 100. The central insertion hole 430B extends from the top end surface 410B to the bottom end surface 420B. When the vent hole 230 and the channel C are plugged with the sealing plug 400B, the sealing plug 400B surrounds the sealing pillar 500B and is clamped between the sealing pillar 500B and the sealing ring 300. The sealing pillar 500B is inserted into the central insertion hole 430B of the sealing plug 400B via an interference fit manner, and the sealing plug 400B is inserted into the channel C via the interference fit manner (as shown in FIG. 12).

In this embodiment, the sealing pillar 500B can increase the contact area between the sealing plug 400B and the sealing ring 300, thereby enhancing the sealing of the vent hole 230.

In this embodiment, the top end surface 410B is coplanar with the outer surface 210, but the disclosure is not limited thereto; in some other embodiments, the top end surface may be non-coplanar with the outer surface.

Figure 14:
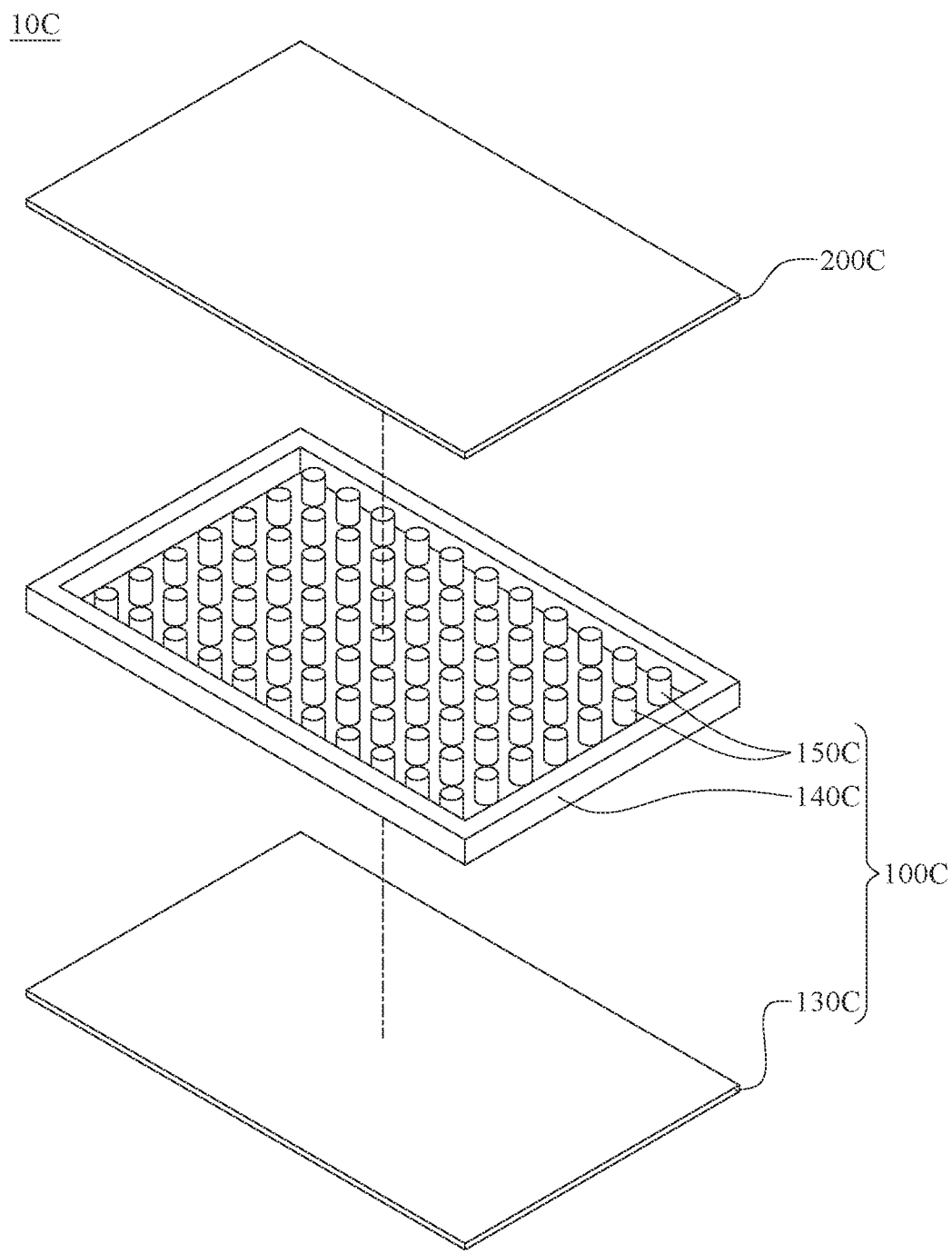
FIG. 14 is an exploded view of a vapor chamber according to a fourth embodiment of the disclosure.

In the aforementioned embodiments, each of the first cover 100 and the second cover 200 is integrally formed as one body via a computer numerical control machine or a forging die, but the disclosure is not limited thereto. Refer to FIG. 14, where FIG. 14 is an exploded view of a vapor chamber 10C according to a fourth embodiment of the disclosure. Since the sealing plug and the sealing ring of the vapor chamber 10C of this embodiment are similar to or the same as the sealing plug 400 and the sealing ring 300 of the previous embodiment, the following paragraphs will not repeatedly introduce them.

In this embodiment, the vapor chamber 10C is configured to accommodate a coolant (not shown), such as water, refrigerant, or a fluid changeable between two phases. The vapor chamber 10C includes a first cover 100C, a second cover 200C. The first cover 100C and the second cover 200C are made of copper, aluminum or another thermally conductive material. The second cover 200C and the first cover 100C are coupled with each other so as to form an interior space together.

In this embodiment, the first cover 100C and the second cover 200C are, for example, made by a stamping process. The first cover 100C includes a plate 130C, a frame 140C, and a plurality of support pillars 150C. The frame 140C and the support pillars 150C are, for example, connected to the plate 130C by a soldering manner. The support pillars 150C are surrounded by the frame 140C. When the second cover 200C and the first cover 100C are coupled with each other, the support pillars 150C support the second cover 200C for enhancing the structural strength of the vapor chamber 10C.

Figure 15:
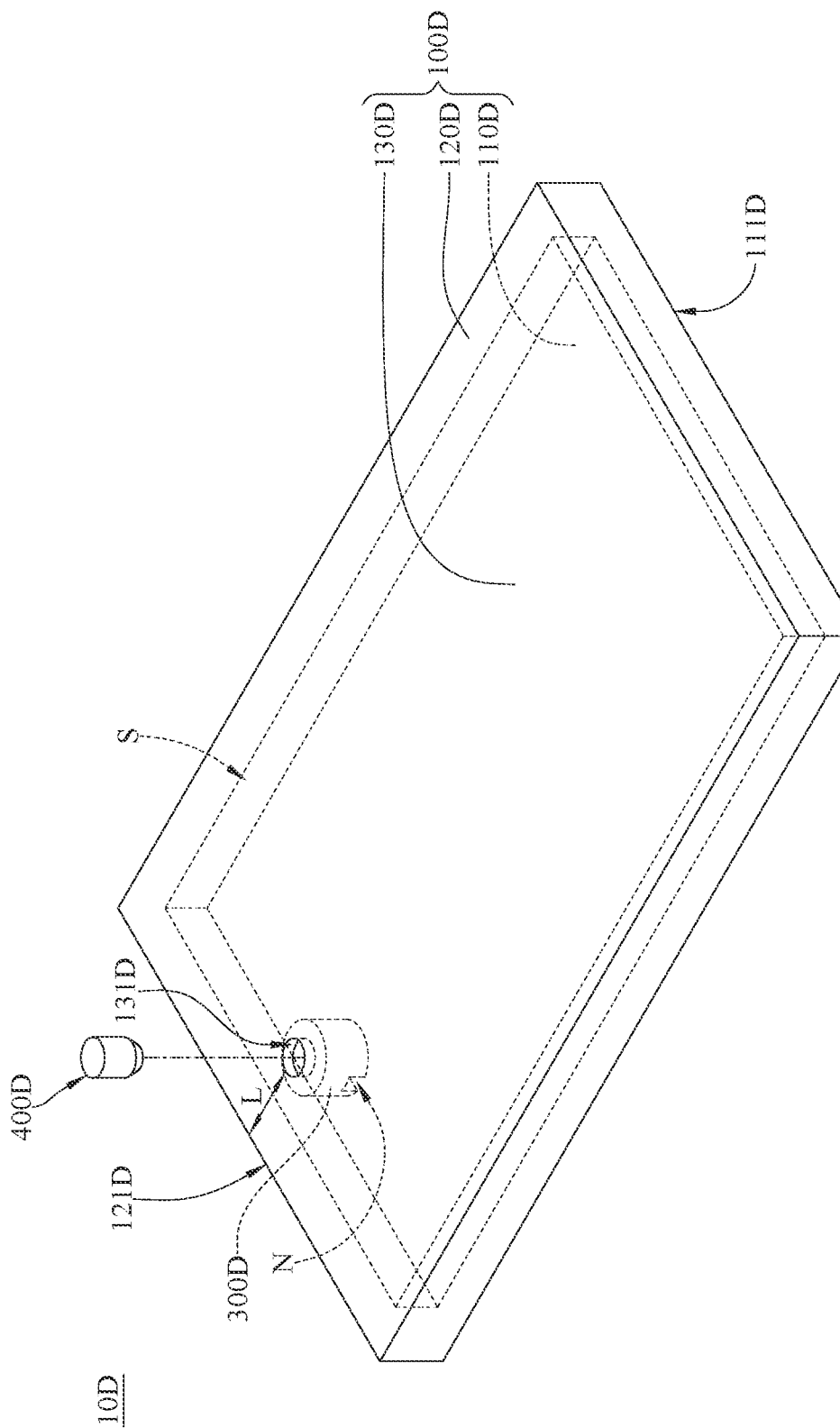
FIG. 15 is an exploded view of a vapor chamber according to a fifth embodiment of the disclosure.

Refer to FIG. 15, where FIG. 15 is an exploded view of a vapor chamber 10D according to a fifth embodiment of the disclosure In this embodiment, the vapor chamber 10D includes a chamber 100D and a sealing plug 400D. The chamber 100D includes a bottom portion 110D, a side portion 120D and a top portion 130D which are integrally formed as one body. The bottom portion 110D, the side portion 120D and the top portion 130D together surround an interior space S. The bottom portion 110D has a thermal contact surface 111D facing away from the interior space S. The side portion 120D has an annular side surface 121D facing away from the interior space S. The top portion 130D has a vent hole 131D. The vent hole 131D is spaced apart from the side portion 120D by a distance L. The vent hole 131D is plugged with the sealing plug 400D so as to seal the interior space S.

In this embodiment, the vapor chamber 10D may further include a sealing ring 300D. The sealing ring 300D has at least one opening N. The sealing ring 300D is clamped between the bottom portion 110D and the top portion 130D, and the vent hole 122D is in fluid communication with the interior space S via the opening N.

According to the vapor chambers as discussed in the above embodiments, since the vent hole is located at the second cover instead of the side edge of the vapor chamber, the rat tail area of the vapor chamber can be reduced so as to keep the appearance of the vapor chamber, thereby increasing the heat dissipation area of the vapor chamber. In addition, since the vent hole for the installation of a degassing pipe is modified to be located at the second cover, the pipe diameter of the degassing pipe is no longer limited by the thickness of the vapor chamber.

In addition, since the vent hole is located at the second cover instead of the side edge of the vapor chamber, the vent hole can be sealed in a convenient manner after the filling/degassing process; that is, a radio frequency heating process and a soldering process can be saved, and thus a capillary structure in the vapor chamber can be prevented from adversely affected by the radio frequency heating process and the soldering process.

In addition, since the thickness of the sealing ring is greater than the thickness of the second cover, the sealing of the vent hole can be enhanced.

Moreover, the recesses and the protrusion portions of the sealing plug and the sealing ring can increase the contact area between the sealing plug and the sealing ring, thereby further enhancing the sealing of the vent hole.

Furthermore, the sealing pillar can increase the contact area between the sealing plug and the sealing ring, thereby enhancing the sealing of the vent hole.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A vapor chamber, comprising:
a first cover, having a thermal contact surface;
a second cover, wherein the second cover is coupled with the first cover so as to form an interior space together, and the second cover has a vent hole;
a sealing ring, having a channel, at least one opening, a support portion, and a first protrusion portion, the at least one opening is in fluid communication with the channel, the sealing ring is clamped between the first cover and the second cover, the vent hole is in fluid communication with the interior space via the channel and the at least one opening, the support portion has a first support end surface, a second support end surface and a first recess, the first support end surface and the second support end surface of the support portion are respectively in contact with the first cover and the second cover, and the first recess is recessed inwards from the second support end surface; and
a sealing plug, wherein the vent hole and the channel are plugged with the sealing plug so as to seal the interior space.

2. The vapor chamber according to claim 1, wherein the vent hole and the channel are plugged with the sealing plug via in an interference fit manner.

3. The vapor chamber according to claim 1, wherein the sealing plug has a top end surface, a bottom end surface and an annular inclined guide surface, the bottom end surface faces away from the top end surface, the annular inclined guide surface is connected to the bottom end surface, a diameter of the bottom end surface is smaller than a diameter of the top end surface, the diameter of the top end surface is greater than a diameter of the vent hole and a diameter of the channel, the diameter of the bottom end surface is smaller than or equal to the diameter of the vent hole and the diameter of the channel, and the vent hole and the channel are plugged with the sealing plug via an interference fit manner.

4. The vapor chamber according to claim 3, wherein the second cover has an outer surface and an inner surface located opposite to each other, a part of the inner surface faces the interior space, another part of the inner surface is in contact with the first cover, and the top end surface is non-coplanar with the outer surface.

5. The vapor chamber according to claim 1, wherein the second cover has an outer surface and an inner surface located opposite to each other, a part of the inner surface faces the interior space, another part of the inner surface is in contact with the first cover, the sealing plug has a top end surface, and the top end surface is coplanar with the outer surface.

6. The vapor chamber according to claim 1, further comprising a sealing pillar, wherein the first cover has an inner surface facing away from the thermal contact surface, the sealing pillar protrudes from the inner surface and is partially located in the vent hole, the sealing plug is in a ring shape, and the sealing plug surrounds the sealing pillar and is clamped between the sealing pillar and the sealing ring.

7. The vapor chamber according to claim 1, wherein a thickness of the sealing ring is larger than a thickness of the second cover.

8. The vapor chamber according to claim 1, wherein the support portion has a first inner bottom surface and a first annular inner side surface forming the first recess, the first inner bottom surface faces away from the first cover, the first annular inner side surface is connected to a periphery of the first inner bottom surface, the first protrusion portion protrudes from the first inner bottom surface and is spaced apart from the first annular inner side surface by a first gap, and the channel penetrates through the first protrusion portion and the support portion along a longitudinal axis of the first protrusion portion.

9. The vapor chamber according to claim 8, wherein the sealing plug comprises a main body and a second protrusion, the main body has a top end surface, a bottom end surface and a second recess, the bottom end surface faces away from the top end surface and faces the first cover, the second recess is recessed inwards from the bottom end surface, the main body has a second inner bottom surface and a second annular inner side surface forming the second recess, the second inner bottom surface faces the first cover, the second annular inner side surface is connected to a periphery of the second inner bottom surface, the second protrusion protrudes from the second inner bottom surface and is spaced apart from the second annular inner side surface by a second gap, the channel is plugged with the second protrusion, the first gap is plugged with a part of the main body, and the second gap is plugged with a part of the first protrusion portion.

10. The vapor chamber according to claim 9, wherein the sealing plug has an annular inclined guide surface, the annular inclined guide surface is connected to the bottom end surface, a diameter of the bottom end surface is smaller than a diameter of the top end surface, the diameter of the top end surface is larger than a diameter of the vent hole and a diameter of the channel, the diameter of the bottom end surface is smaller than or equal to the diameter of the vent hole and the diameter of the channel, the vent hole, the channel and the first gap are plugged with the main body and the second protrusion of the sealing plug in an interference fit manner.

11. The vapor chamber according to claim 1, wherein the first cover comprises a plate, a frame and a plurality of support pillars, the frame is connected to the plate, and the plurality of support pillars are connected to the plate and surrounded by the frame.

12. The vapor chamber according to claim 11, wherein the frame and the plurality of support pillars are welded to the plate.

* * * * *